(12) United States Patent
Gole et al.

(10) Patent No.: US 6,940,086 B2
(45) Date of Patent: Sep. 6, 2005

(54) TIN OXIDE NANOSTRUCTURES

(75) Inventors: James L. Gole, Atlanta, GA (US); Z. L. Wang, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 129 days.

(21) Appl. No.: 10/261,149

(22) Filed: Sep. 30, 2002

(65) Prior Publication Data

US 2003/0067003 A1 Apr. 10, 2003

Related U.S. Application Data

(60) Provisional application No. 60/325,677, filed on Sep. 28, 2001.

(51) Int. Cl.[7] .............................................. H01L 29/06
(52) U.S. Cl. ........................................... 257/9; 257/14
(58) Field of Search ............................................ 257/9

(56) References Cited

U.S. PATENT DOCUMENTS 6,344,271 B1 * 2/2002 Yadav et al. ................. 428/402
6,586,095 B2 * 7/2003 Wang et al. ................. 428/397

OTHER PUBLICATIONS

Dai, Pan and Wang; Gallium Oxide Nanoribbons and Nanosheets: pp. 1–14.
Pan, Dai and Wang; Lead Oxide Nanobelts and Phase Transformation Induced by Electron Beam Irradiation, Aug., 2001; pp. 1–13.
Pan, Dai and Wang; Nanobelts and Semiconducting Oxides; Mar. 9, 2001; pp. 1947–1949.
Coutts, Young and Li; Characterization of Transparent Conducint Oxides; Aug. 2000; pp. 58–65.
Lewis and Paine; Applications and Processing of Transparent Conducting Oxides; Aug., 2000; pp. 22–26.
Gordon; Criteria for Choosing Transparent Conductors; Aug., 2000; pp. 52–57.
Kawazoe, Yanagi; Ueda, and Hosono; Transparent p–Type Conducting Oxides; Design and Fabrication of p–n Heterojunctions; Aug. 2000; pp. 28–35.
Minami; New n–Type Transparent Conducting Oxides; Aug. 2000; pp. 38–43.
Wang; Semiconducting Oxides Prepared in the Form of Nanobelts; Aug., 2001; pp. 603–604.
Z.R. Dai, J.L. Gole, J.D. Strout, and Z.L. Wang; Tin Oxide Nanowires, Nanoribbons, and Nanotubes: Oct. 26, 2001; J. Phys. Chem. B 2002, 106; pp. 1274–1279.

* cited by examiner

*Primary Examiner*—Doulas A. Wille
(74) *Attorney, Agent, or Firm*—Thomas, Kayden, Horstemeyer & Risley, LLP

(57) ABSTRACT

Tin oxide nanostructures and methods of fabricating tin oxide nanostructures are disclosed. Representative nanostructures include $SnO_2$ nanowires, $SnO_2$ nanoribbons, and $SnO_2$ nanotubes. Another representative nanostructure includes a nanostructure having a rutile crystal lattice and an orthorhombic crystal superlattice. The nanostructure can include, but is not limited to, $SnO_2$ nanowires, $SnO_2$ nanoribbons, and $SnO_2$ nanotubes.

44 Claims, 10 Drawing Sheets

TIN OXIDE NANOSTRUCTURES

CROSS-REFERENCE TO RELATED APPLICATION

This application claims priority to copending U.S. Provisional Application entitled, "TIN OXIDE NANOWIRES, NANORIBBONS, AND NANOTUBES," filed with the United States Patent and Trademark Office on Sep. 28, 2001, and assigned Ser. No. 60/325,677, which is entirely incorporated herein by reference.

TECHNICAL FIELD

The present invention is generally related to nanostructures and, more particularly, is related to tin oxide nanostructures and fabrication thereof.

BACKGROUND

Binary semiconducting oxides often have distinctive properties and can be used as transparent conducting oxide (TCO) materials and gas sensors. Current studies of semiconducting oxides have been focused on two-dimensional films and zero-dimensional nanoparticles. For example, fluorine-doped tin oxide films are used in architectural glass applications because of their low emissivity for thermal infrared heat. Tin-doped indium oxide (TIO) films can be used for flat panel displays (FPDs) due to their high electrical conductivity and high optical transparency, and zinc oxide can be used as an alternative material for TIO because of its lower cost and easier etchability. Tin oxide nanoparticles can be used as sensor materials for detecting the leakage of several inflammable gases, such as carbon monoxide, owing to their high sensitivity to low gas concentrations.

In contrast, investigations of wire-like semiconducting oxide nanostructures can be difficult due to the lack of availability of nanowire structures. Wire-like nanostructures have attracted extensive interest over the past decade due to their great potential for addressing basic issues about dimensionality and space confined transport phenomena, as well as related applications. In terms of geometrical structures, these nanostructures can be classified into two main groups: hollow nanotubes and solid nanowires, which have a common characteristic of cylindrical symmetric cross-sections. Besides nanotubes, many other wire-like nanomaterials, which include carbides, nitrides, compound semiconductors, elemental semiconductors, and oxide nanowires have been successfully fabricated.

However, the nanostructures discussed above can have a variety of deficiencies. For example, often it is difficult to control the structure and morphology of many nanostructures. Thus, a heretofore unaddressed need exists in the industry to address at least the aforementioned deficiencies and/or inadequacies.

SUMMARY OF THE INVENTION

Briefly described, the present invention provides for new types of nanostructures. Representative nanostructures include $SnO_2$ nanowires, $SnO_2$ nanoribbons, and $SnO_2$ nanotubes. Another representative nanostructure includes a nanostructure having a rutile crystal lattice and an orthorhombic crystal superlattice. The nanostructure can include, but is not limited to, $SnO_2$ nanowires, $SnO_2$ nanoribbons, and $SnO_2$ nanotubes.

The present invention also involves a method of preparing $SnO_2$ nanostructures. A representative method includes: forming a plurality of layers of tin (Sn) and tin oxide (SnO); and heating the plurality of layers to between about 1000° C. and 1200° C. for between about 3 and 12 hours at a pressure of between about 150 Torr and 750 Torr.

Another representative method includes: providing an oxygen lean environment by alternating layers of tin (Sn) and tin oxide (SnO); heating the plurality of layers to between about 1000° C. and 1200° C. for between about 3 and 12 hours at a pressure of between about 150 Torr and 750 Torr; and forming an $SnO_2$ nanostructure.

Still another representative method includes: providing tin oxide (SnO) powder in an oxygen lean environment; heating the SnO powder to between about 1000° C. and 1200° C. for between about 3 and 12 hours at a pressure of between about 150 Torr and 750 Torr; and forming an $SnO_2$ nanostructure Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1A is a scanning electron microscope (SEM) image showing the morphology of the tin oxide ($SnO_2$) nanostructures of the present invention, while FIG. 1B is an enlarged SEM image of a portion of the SEM image shown in FIG. 1A.

FIG. 2A is a low magnification transmission electron microscopy (TEM) image of an $SnO_2$ nanowire having rutile lattice structure, while FIG. 2B is a high-resolution TEM image of the $SnO_2$ nanowire shown in FIG. 2A. FIG. 2C is a fast Fourier transform (FFT) of the image shown in FIG. 2B. FIG. 2D is a SAD pattern from the $SnO_2$ nanostructure shown in FIG. 2A.

FIG. 3A is a TEM image of an $SnO_2$ nanowire having a twin structure, while FIG. 3B is a high resolution TEM (HRTEM) image of the twin and the inset in FIG. 3B is the corresponding FFT of the HRTEM image. FIG. 3C is an electron diffraction pattern of the $SnO_2$ nanowire shown in FIG. 3A.

FIG. 4A is a low magnification TEM image of another $SnO_2$ nanowire having a rutile crystal lattice and orthorhombic crystal superlattice structure, while FIG. 4B is an HRTEM image corresponding to the $SnO_2$ nanowire shown in FIG. 4A. The inset in the upper righthand corner of FIG. 4B is a select area electron diffraction pattern obtained for the $SnO_2$ nanowire shown in FIG. 4A. The inset in the lower righthand corner of FIG. 4B is a FTT of the HRTEM image shown in FIG. 4B.

FIG. 5A is a TEM image of another $SnO_2$ nanoribbon having a rutile crystal lattice and orthorhombic crystal superlattice structure, while FIG. 5B is a select area electron diffraction pattern of the $SnO_2$ nanoribbon shown in FIG. 5A. FIGS. 5C and 5D are microdiffraction patterns taken from the center and edge, respectively, of the $SnO_2$ nanoribbon shown in FIG. 5A.

FIGS. 7A and 7B are TEM images of two wide $SnO_2$ nanoribbons having a rutile crystal lattice and orthorhombic crystal superlattice structure, while FIGS. 7C and 7D are enlarged images of a portion of each of the $SnO_2$ nanoribbons shown in FIGS. 7A and 7B.

FIGS. 10A, 10B, 10C, 10D are TEM images of $SnO_2$ nanotubes having a rutile crystal lattice and orthorhombic crystal superlattice structure, while FIG. 10E is a selected area electron diffraction (SAD) pattern taken for the $SnO_2$ nanotube shown in FIG. 10B.

DETAILED DESCRIPTION

Figures 1A, 1B:
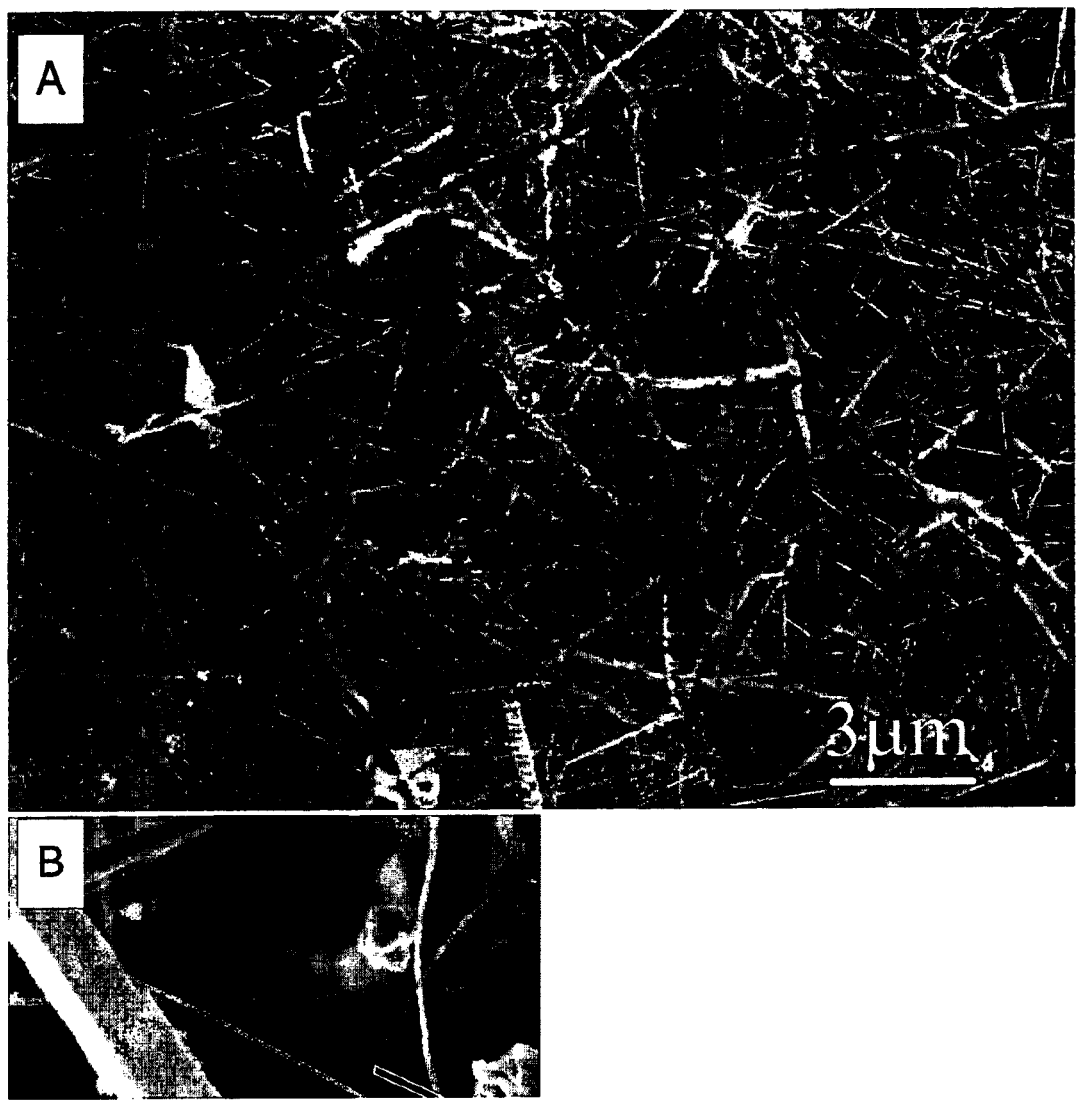

Embodiments of the present invention provide for nanostructures and methods of fabrication thereof. The nanostructures can include nanowires, nanoribbons, and nanotubes. In particular, embodiments of the present invention provide for tin oxide ($SnO_2$) nanostructures and methods of fabrication thereof that have a rutile crystal lattice structure or a rutile crystal lattice and orthorhombic crystal superlattice structure (i.e., a simultaneous rutile and orthorhombic crystal lattice structure). In particular, one type of $SnO_2$ nanowire has a rutile crystal lattice structure, while another type of $SnO_2$ nanowire has a rutile crystal lattice and orthorhombic crystal superlattice structure. The $SnO_2$ nanoribbons and $SnO_2$ nanotubes have a rutile crystal lattice and orthorhombic crystal superlattice structure.

The fabrication process conditions for the $SnO_2$ nanostructures is conducted under oxygen lean conditions. For example, an oxygen lean environment can be readily achieved by heating alternating layers of tin (Sn) (i.e., tin foil) and tin oxide (SnO) powder in a nitrogen and/or argon atmosphere. Subsequently, $SnO_2$ nanostructures are produced. Alternatively, an oxygen lean environment can be achieved by heating SnO powder under more stringent experimental conditions (i.e., about 200 Torr of argon and/or nitrogen in a slightly reducing atmosphere). Subsequently, $SnO_2$ nanostructures are produced.

The apparatus used to fabricate the $SnO_2$ nanostructures includes a double concentric alumina tube combination that can be heated to the desired temperature (i.e., 1050–1150° C.) in a Lindberg Scientific™ tube furnace configuration. The inner alumina tube is vacuum-sealed by two water-cooled stainless steel end pieces, which are attached to the alumina tube and tightly lock-press fit against custom viton o-rings. At one end of the furnace, an entrainment gas (e.g., nitrogen or argon) enters through the upstream stainless steel end piece and passes through a matched set of zirconia insulators to the central region of the inner tube oven. Here, the entraining gas flows over a crucible containing the sample mixture of interest at a flow rate between about 50 and 100 standard cubic centimeters per minute (sccm) controlled by a flow controller.

The total tube pressure in the inner tube can range from 200 to 800 Torr as measured by a Baratron™ differential pressure transducer, but is typically between about 200–400 Torr. The pressure in the inner tube can be controlled by a mechanical pump attached to the inner alumina tube through a downstream stainless steel end piece. This end piece is mechanically attached to a "water cooled" cold plate, whose temperature is adjustable through a matching set of insulating zirconia blocks. Depending on the desired temperature range of operation, the crucibles used to contain the layered Sn and SnO, or SnO, were commercially available alumina (1400–1500° C.) or were machined from low porosity carbon (1500° C.). The parameters that can be controlled in this experiment were (1) gas flow rate, (2) total tube gas pressure, (3) central region temperature and temperature gradients to the end regions, and (4) cold plate temperature. The entraining gas was not heated before it entered the inner furnace tube, although it could be heated.

In particular, $SnO_2$ nanostructures have been synthesized by passing a nitrogen or argon entrainment gas over a crucible located in the central region of the inner tube of a sealed double concentric alumina tube-oven configuration described above. The parameters controlled in this experiment were (1) nitrogen or argon flow rate, (2) total tube gas pressure, (3) central region temperature and (4) temperature gradients to the end regions. The alumina crucible used to contain the reactant mixture used in these experiments was heated to between about 1050–1150° C. and maintained at that temperature for about 3 to 14 hours, about 10 to 14 hours, and preferably about 12 hours. The alumina crucible can contain alternating layers of Sn (high purity tin foil) and SnO or powdered SnO. The nitrogen and/or argon flow rate was typically about 50 to 100 sccm, while the total tube pressure for the sealed inner tube was about 200–400 Torr controlled by a valved Welch™ 1402 mechanical pump. A light to dark gray fluffy product was collected on the alumina tube wall near the downstream point where the double concentric alumina tube configuration exits the Lindberg™ oven and where the temperature is in the range between 450 and 500° C. Additional products are collected on the cold plate, which is positioned approximately 6 inches into the tube furnace, fronting the downstream zirconia insulation. This cold plate is maintained at a temperature of between about 25–40° C.

The as-synthesized products are characterized by scanning electron microscopy (SEM) (Hitachi™ S-800 FEG), transmission electron microscopy (TEM)(Hitachi™ HF-2000 FEG with energy dispersive x-ray spectroscopy (EDS)) at 200 kV and a JEOL™ 4000EX high resolution TEM (HRTEM) at 400 kV.

As discussed above, an oxygen lean environment can be achieved by placing alternating layers of Sn and SnO in the crucible in a nitrogen and/or argon atmosphere and heating the layered Sn and SnO. For example, a first layer of SnO is placed into the crucible and then a first layer of Sn is placed over the first layer of SnO. Next, a second layer of SnO is placed over the first layer of Sn and then a second layer of Sn is placed over the second layer of SnO and, so forth. The bottom layer can be either Sn or SnO, however, the preferred embodiment of the bottom layer is SnO. Similarly, the top layer can be either Sn or SnO, however, the preferred embodiment of the top layer is SnO. Subsequently, the layered Sn/SnO is heated in a nitrogen and/or argon atmosphere.

Alternatively, an oxygen lean environment can be achieved by placing SnO powder in the crucible under conditions in which argon and/or nitrogen is used as the entraining gas in a slightly reducing atmosphere. Subsequently, the layered SnO is heated to produce $SnO_2$ nanostructures.

Having summarized the $SnO_2$ nanostructures and methods of fabrication thereof above, reference will now be made in detail to four illustrative examples of the $SnO_2$ nanostructures. While the invention is described in connection with these examples, there is no intent to limit the invention to the following examples. On the contrary, the intent is to cover all alternatives, modifications, and equivalents included within the spirit and scope of the invention.

Examples 1-4 are discussed in the paper entitled "Tin Oxide Nanowires, Nanoribbons, and Nanotubes," by Dai et al. (*J. Phys. Chem. B*, 106, 1274, (2002)), which is herein incorporated by reference.

EXAMPLE 1

Tetragonal (Rutile) Structured $SnO_2$ Nanowires $SnO_2$ nanowires having a rutile (tetragonal) crystal lattice structure have been formed using the apparatus discussed above. FIG. 1A is a SEM showing the morphology of products formed by heating layered Sn/SnO at a furnace temperature of about 1125° C. and at a pressure of about 400 Torr. The flow rate of nitrogen, the entraining gas, is about 100 standard cubic centimeters per minute (sccm). The products are dominated by wire-like nanostructures whose diameter varies over a broad range from about ten nanometers to a micrometer. The typical length of the nanowires ranges from about ten micrometers to about 300 micrometers. The cross-sectional shape of the nanowires can vary from virtually circular to the larger rectangle-like structure as shown in FIG. 1B. The chemical composition of the nanowires is determined by EDS to be close to $SnO_2$.

Figures 2A, 2B, 2C, 2D:
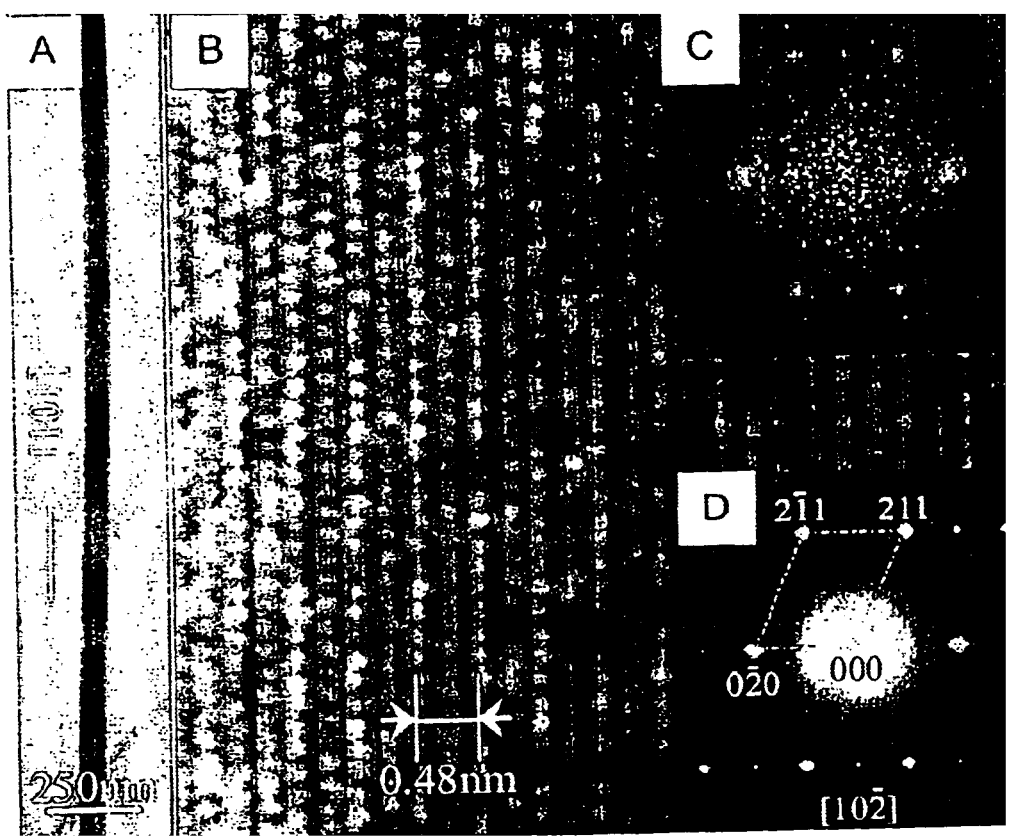

In general, the $SnO_2$ nanowires are substantially straight and have a diameter between about 10 and 100 nanometers, as shown in FIG. 2A. The crystallography of the $SnO_2$ nanowires has been examined using select area electron diffraction (SAD) (FIG. 2D) and HRTEM imaging (FIG. 2B) combined with a fast Fourier transform (FFT) analysis technique (FIG. 2C). The results indicate that the $SnO_2$ nanowires have a normal rutile crystal structure (a=0.470 nm, and c=3.188 nm). The $SnO_2$ nanowires also display a rectangular cross section enclosed by ±(010) and ±(10$\bar{1}$) facet planes, and a thickness-to-width aspect ratio ranging from 1:2 to 1:5. The growth direction of the $SnO_2$ nanowires is parallel to the [101] crystal direction.

Figures 3A, 3B, 3C:
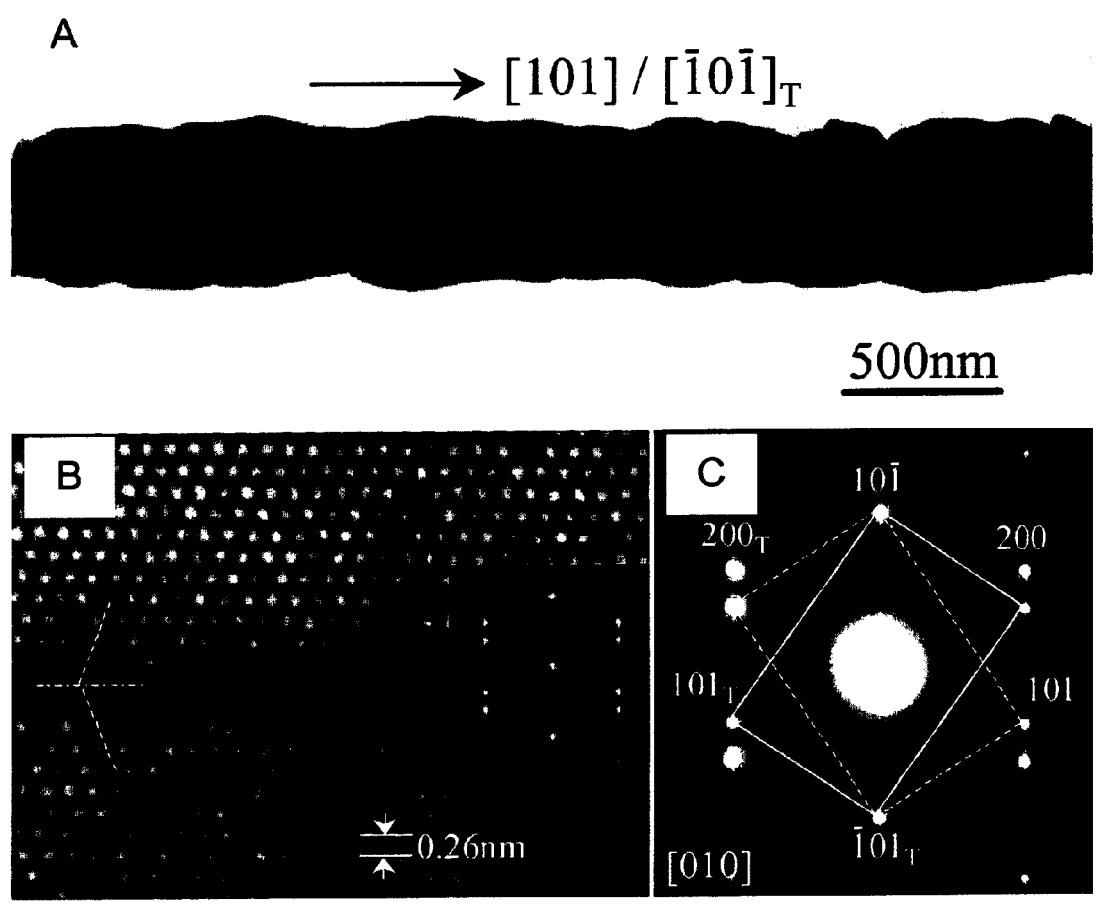

FIG. 3A depicts the TEM image of another $SnO_2$ nanowire with a single twin structure formed by vaporizing SnO powder at a furnace temperature of about 1050° C. and at a pressure of about 250 Torr (argon). The corresponding SAD pattern is shown in FIG. 3C. Here, the "twin" reflections are indexed with a subscript "T" and the remaining matrix reflection indices are marked without subscript. The zone axis of the diffraction pattern is [010] for the rutile $SnO_2$ crystal lattice portion of the $SnO_2$ nanowire. The twinning plane is determined to be (10$\bar{1}$) and the twinning direction is [101], parallel to the growth direction of the $SnO_2$ nanowire. The twin also can be regarded as being formed by one part of the crystal (twin) rotated 180° along the normal direction of the (10$\bar{1}$) crystal plane while the remaining sections of the crystal (matrix) maintain the original orientation. FIG. 3B illustrates a HRTEM image around the twin boundary that is completely coherent, with no relative displacement. The inset corresponds to the FFT of the HRTEM image, which is consistent with the experimental electron diffraction pattern shown in FIG. 3C.

EXAMPLE 2

Orthorhombic Structured $SnO_2$ Nanowires $SnO_2$ nanowires having a rutile crystal lattice and an orthorhombic crystal superlattice (hereinafter orthorhombic $SnO_2$ nanowires) have been formed using the apparatus discussed above. The orthorhombic $SnO_2$ nanowires have a diameter between about 10 nanometers and 100 nanometers, and a length of between about 10 micrometers and 300 micrometers.

Figures 4A, 4B:
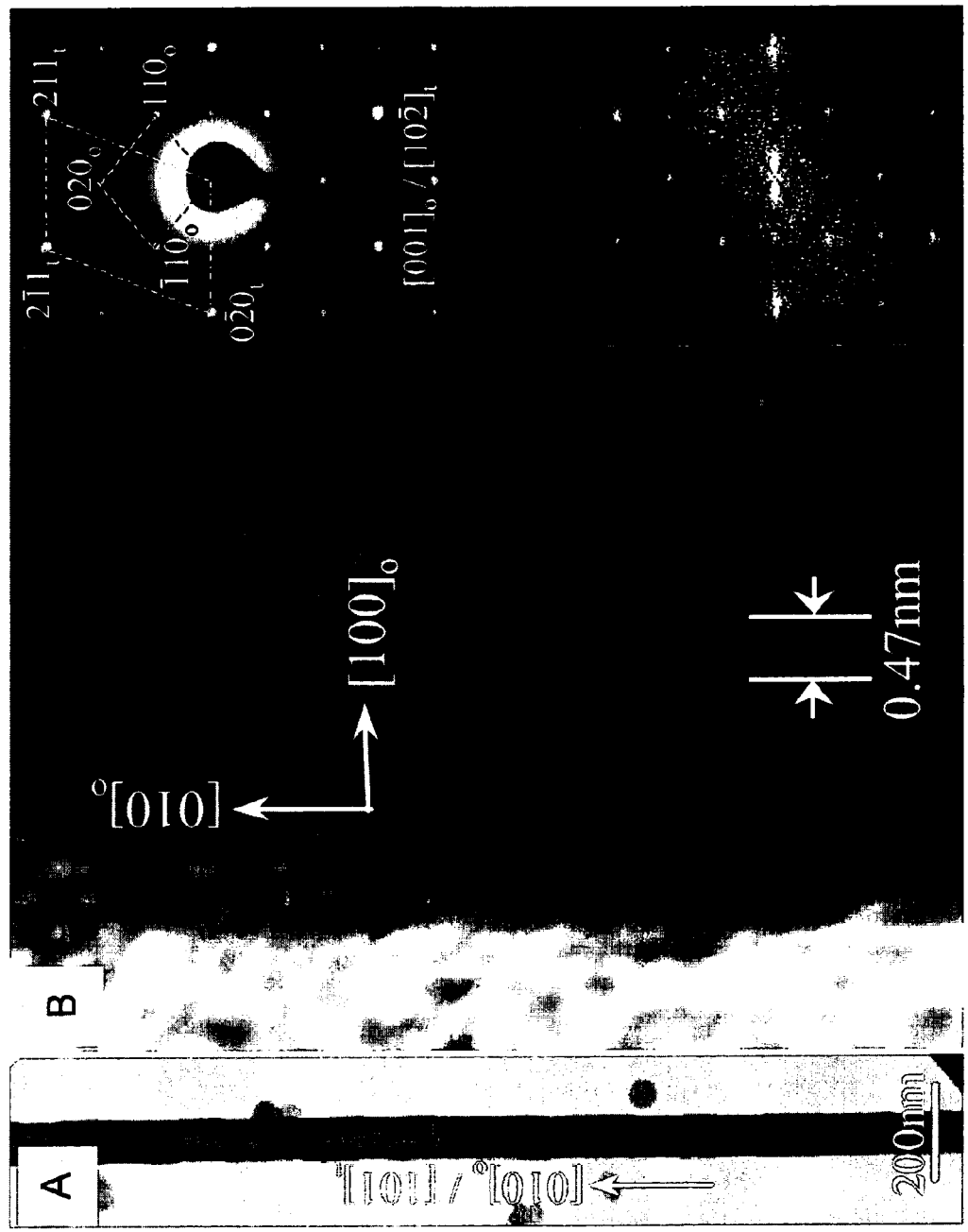

FIG. 4A illustrates a low magnification TEM image of one orthorhombic $SnO_2$ nanowire formed by heating layered Sn/SnO to a furnace temperature of about 1050° C. and at a pressure of about 200 Torr. FIG. 4B is a HRTEM image corresponding to the orthorhombic $SnO_2$ nanowire shown in FIG. 4A. The inset at the upper right-hand corner of FIG. 4B is an experimental SAD pattern of the orthorhombic $SnO_2$ nanowire. A matched pattern is reproduced by the FFT of the HRTEM image, as inserted at the bottom right-hand corner of FIG. 4B. The configuration of the reflections with strong intensities in the SAD pattern (inset) is the same as that for the [10$\bar{2}$] crystal zone of the rutile $SnO_2$ crystal lattice (FIG. 2D). Some extra weak reflections, however, are clearly seen in the SAD pattern inserted in FIG. 4B. Their geometrical configuration is commensurate to that of the strong reflections, indicating the formation of a superlattice structure associated with the rutile $SnO_2$ crystal lattice. The superlattice is determined to match that of an orthorhombic $SnO_2$ crystal superlattice having the lattice parameters: a=0.4714 nm, b=0.5727 nm, and c=0.5214 nm. This observation is somewhat surprising as previous bulk phase studies suggest that the orthorhombic lattice is formed only under high pressure conditions. (Suito, et al., *Mater. Res. Bull.*, 10, 677, (1975)). The SAD pattern corresponds to the $[001]_o$ crystal zone of the orthorhombic $SnO_2$ crystal superlattice. The indexes with a subscript "o" correspond to the orthorhombic $SnO_2$ crystal superlattice, whereas the basic reflections indexed on the basis of the normal rutile $SnO_2$ crystal lattice are denoted with a subscript "t."

The determined orientation relationship between the orthorhombic $SnO_2$ crystal superlattice and the rutile $SnO_2$ crystal lattice corresponds to $[001]_o \| [10\bar{2}]_t$ and $(100)_o \| (010)_t$. Assuming the cross-sectional shape of the orthorhombic $SnO_2$ nanowire is rectangular, the orthorhombic $SnO_2$ nanowire is enclosed by $\pm(100)_o/\pm(010)_t$ and $\pm(001)_o/\pm(10\bar{1})_t$, its growth direction being along the $[010]_o$ crystal direction that is parallel to $[101]_t$ of the rutile $SnO_2$ crystal lattice.

EXAMPLE 3

Figures 5A, 5B, 5C, 5D:
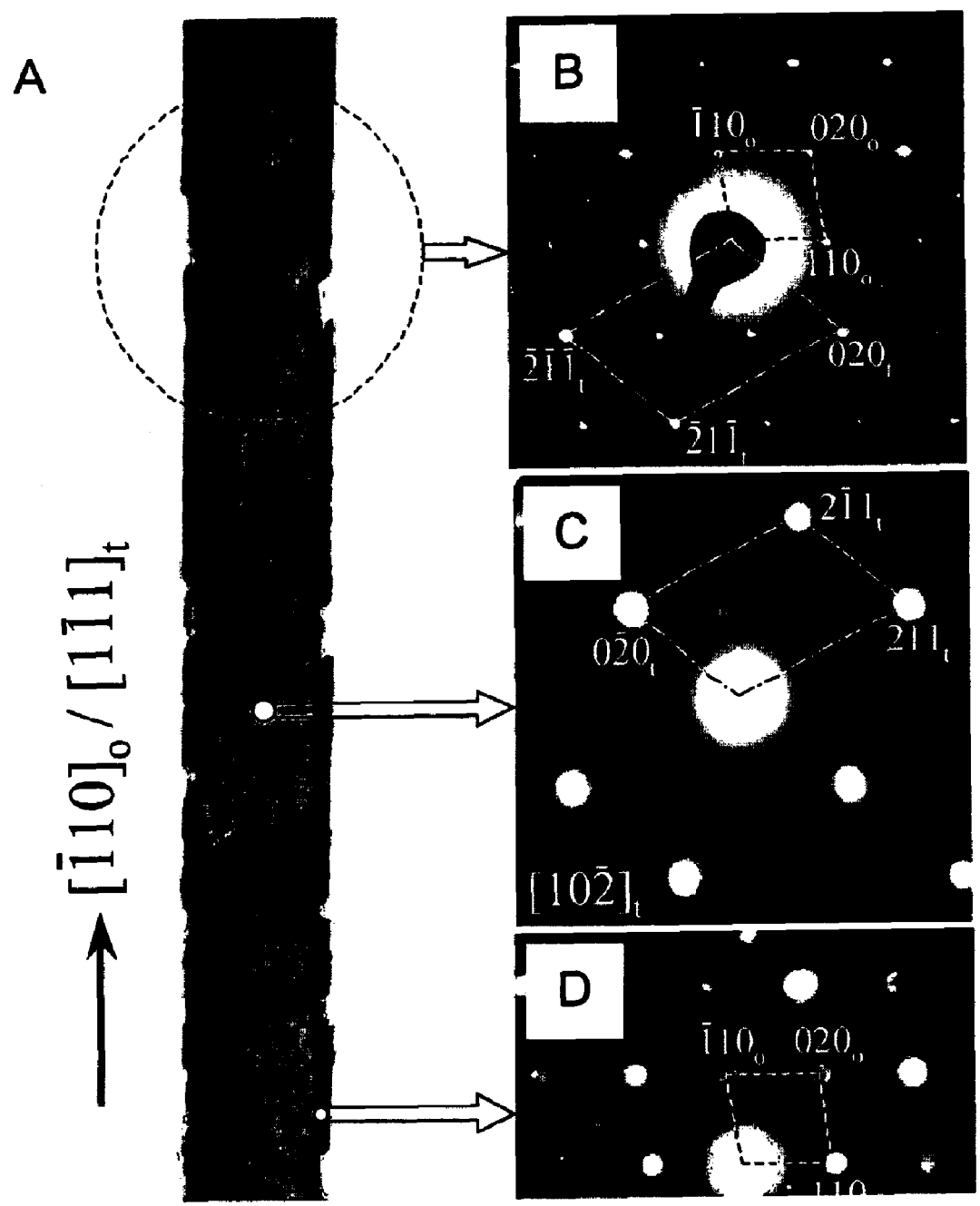
Figure 6:
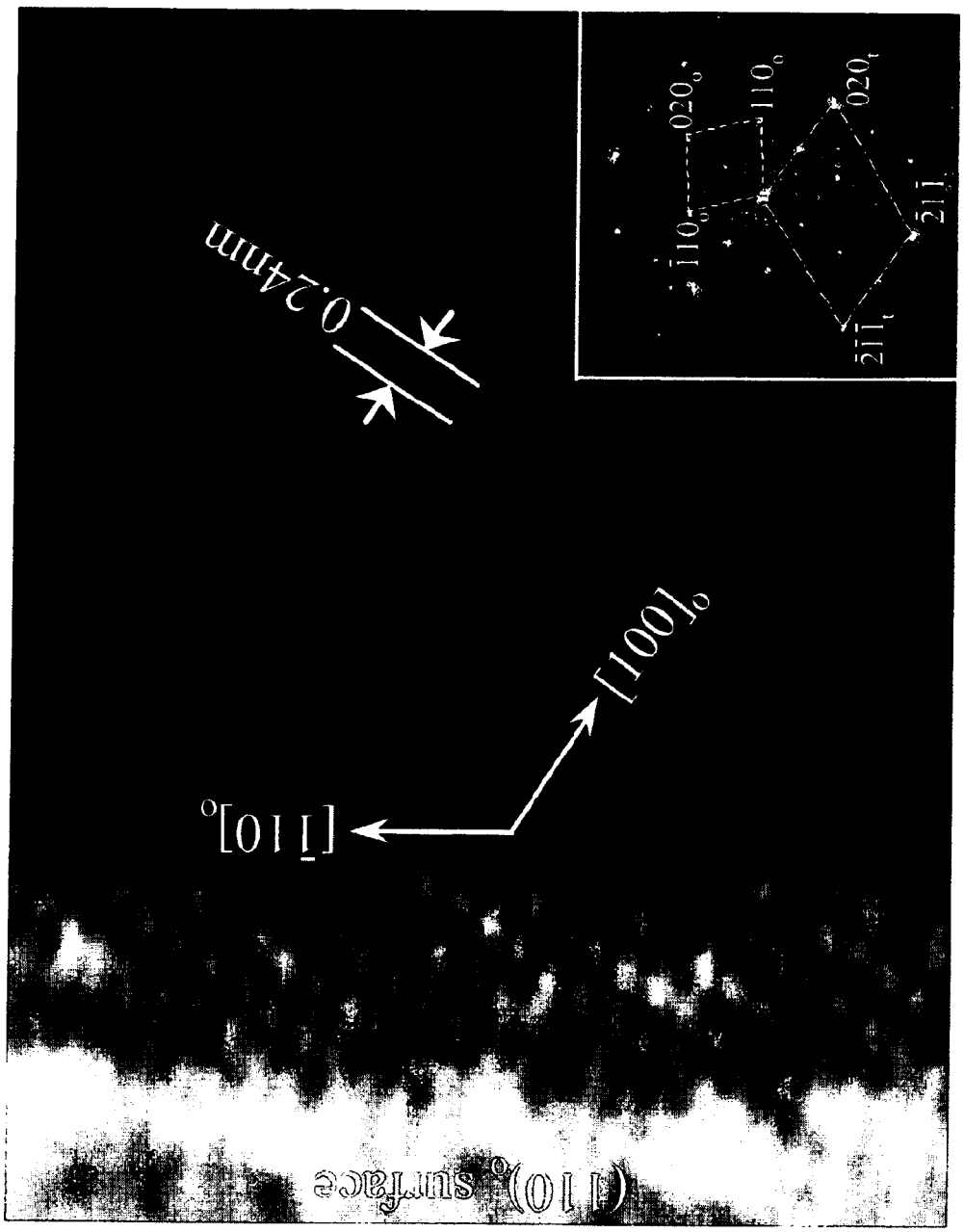
FIG. 6 is an HRTEM image of the edge area of the $SnO_2$ nanoribbon shown in FIG. 5A, while the inset is an FTT of the corresponding image shown in FIG. 6.

Sandwiched $SnO_2$ Nanoribbons $SnO_2$ nanoribbons having a rutile crystal lattice and an orthorhombic crystal superlattice structure have been formed using the apparatus discussed above by heating layered Sn/SnO to a furnace temperature of about 1050° C. and at a pressure in the range of about 250 Torr to about 700 Torr, as shown in FIG. 5A. The $SnO_2$ nanoribbons have a length of between about 10 micrometers and 300 micrometers. The $SnO_2$ nanoribbon shown in FIG. 5A includes two side layers whose thickness is about 20 nm and a core layer with a width of about 120 nm and is then termed a sandwiched $SnO_2$ nanoribbon. Although small parts of the side layers are missing, the sandwiched $SnO_2$ nanoribbon appears to have a generally uniform width over its entire length. The composition of the sandwiched $SnO_2$ nanoribbon also approaches that of $SnO_2$ as determined by EDS. The SAD pattern (FIG. 5B) indicates that the sandwiched $SnO_2$ nanoribbon is not a purely rutile $SnO_2$ crystal lattice, but likely has significant orthorhombic $SnO_2$ crystal superlattice character since the reflections corresponding to an orthorhombic $SnO_2$ crystal superlattice are observed. In order to understand further the crystal structure of the sandwiched $SnO_2$ nanoribbon, electron micro-diffraction patterns have been recorded for the core layer (FIG. 5C) and side layer (FIG. 5D), respectively. The reflections corresponding to the rutile $SnO_2$ crystal lattice are very strong in the micro-diffraction pattern taken of the center of the core layer (FIG. 5C) although very weak reflections corresponding to orthorhombic $SnO_2$ crystal superlattice can be identified. The microdiffraction pattern from the side layer (FIG. 5D), however, displays a notably stronger diffraction feature for orthorhombic $SnO_2$ crystal lattice The superlattice reflection observed in the pattern recorded from the center of the nanoribbon may come from the top and bottom surface layers that are dominated by the orthorhombic lattice. FIG. 6 illustrates the HRTEM image recorded near the edge layer, and the corresponding FFT given in the inset shows that the orthorhombic $SnO_2$ crystal superlattice is formed in the edge layer. The surface of the sandwiched $SnO_2$ nanoribbon edge is not flat at the atomic level, as indicated by its HRTEM image (FIG. 6). The orthorhombic $SnO_2$ crystal superlattice and the rutile $SnO_2$ crystal lattice portions of the sandwiched $SnO_2$ nanoribbon are coherent with the orientation relationship $[001]_o \| [10\bar{2}]_r$ and $(100)_o \| (010)_r$. This is virtually the same relationship as that deduced for the corresponding orthorhombic $SnO_2$ nanowires considered above. The sandwiched $SnO_2$ nanoribbons, however, are enclosed by $\pm(110)_o/\pm(231)_r$ and $\pm(001)_o/\pm(10\bar{1})_r$, and their growth directions are parallel to $[\bar{1}10]_o/[\bar{1}11]_r$.

Figures 7A, 7B, 7C, 7D:
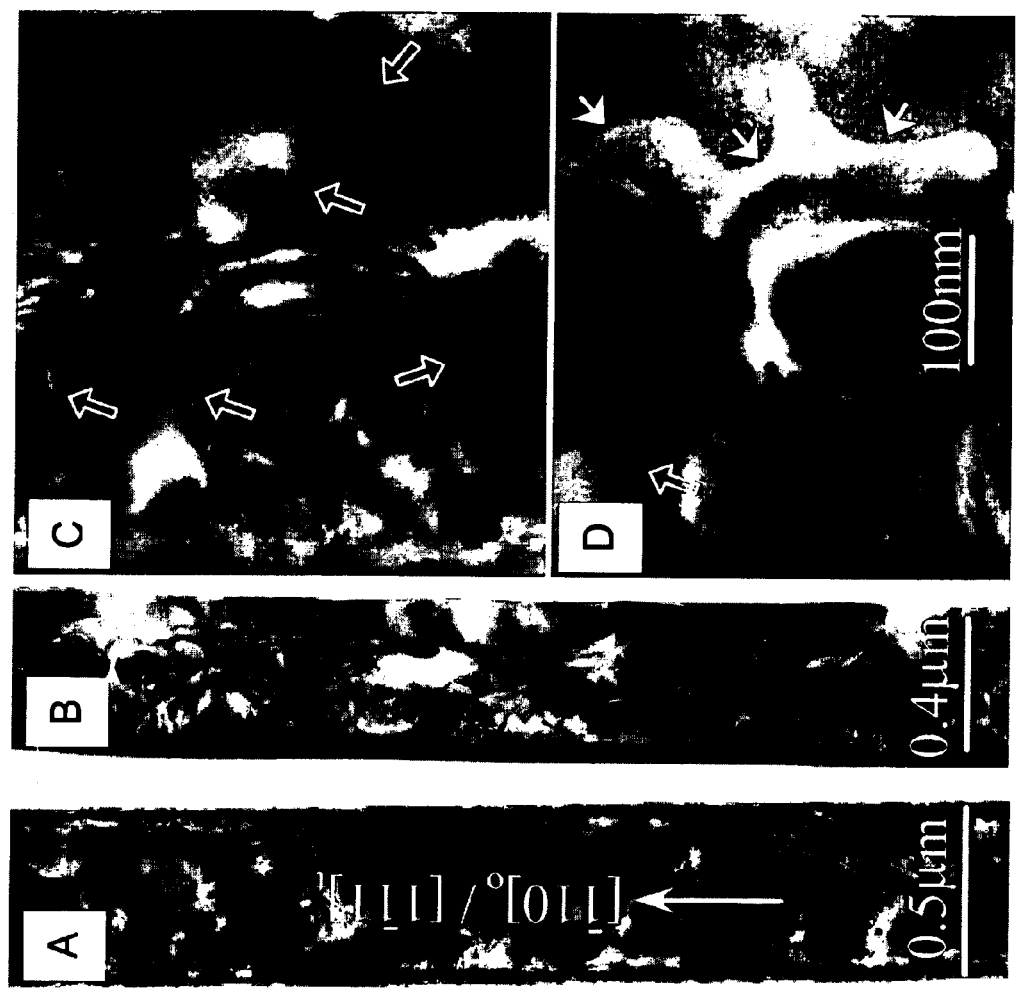

The contrast over sandwiched $SnO_2$ nanoribbons with smaller widths, similar to that shown in FIG. 6A, is, in general, uniform. With an increase in width, however, the contrast over the sandwiched $SnO_2$ nanoribbon becomes complex, as indicated in FIGS. 7A and 7B where two wide sandwiched $SnO_2$ nanoribbons with width of order 500 nm are shown. The wide sandwiched $SnO_2$ nanoribbons shown in FIGS. 7A and 7B were produced by heating SnO powder to a furnace temperature of about 1050° C. and at a pressure of about 250 Torr.

FIG. 7B illustrates a sandwiched $SnO_2$ nanoribbon that has only one side layer. The thickness of the surface layers does not significantly increase as the width of the sandwiched $SnO_2$ nanoribbons increases. Although the contrast displayed is complicated, the entire sandwiched $SnO_2$ nanoribbon is single crystalline and the SAD pattern is identical to that given in FIG. 5B. FIGS. 7C and 7D illustrate two enlarged images of local areas in the sandwiched $SnO_2$ nanoribbon as shown in FIG. 7B. Here, dislocations can be identified, as indicated by the open arrowheads.

Figure 8:
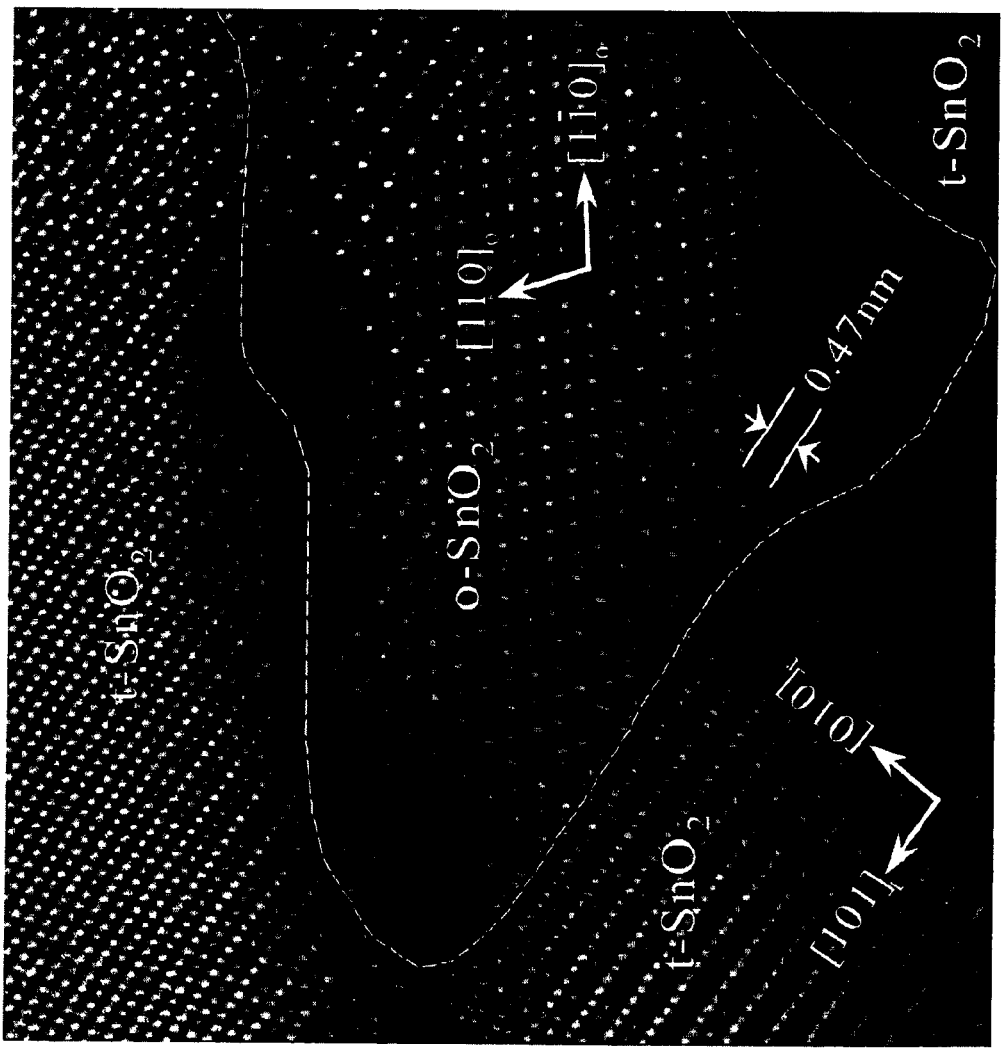
FIG. 8 is an HRTEM image showing the unique domains formed between rutiletin oxide (r—$SnO_2$) and orthorhombic tin oxide (o—$SnO_2$) shown in FIG. 7A.

In addition, a domain-like boundary can also be identified in the sandwiched $SnO_2$ nanoribbon, as marked by solid arrowheads in FIG. 7D. FIG. 8 illustrates an HRTEM image associated with this boundary region. This indicates that a domain boundary is formed by the rutile $SnO_2$ (t—$SnO_2$) crystal lattice and the orthorhombic $SnO_2$ (o—$SnO_2$) crystal lattice. The boundary is semi-coherent and not abrupt on the atomic scale. The dash line marked in FIG. 8 represents this boundary schematically. This suggests that the large width sandwiched $SnO_2$ nanoribbons correspond to a mixed phase $SnO_2$ crystal lattice structure, where dislocations and domain boundaries co-exist.

Figure 9:
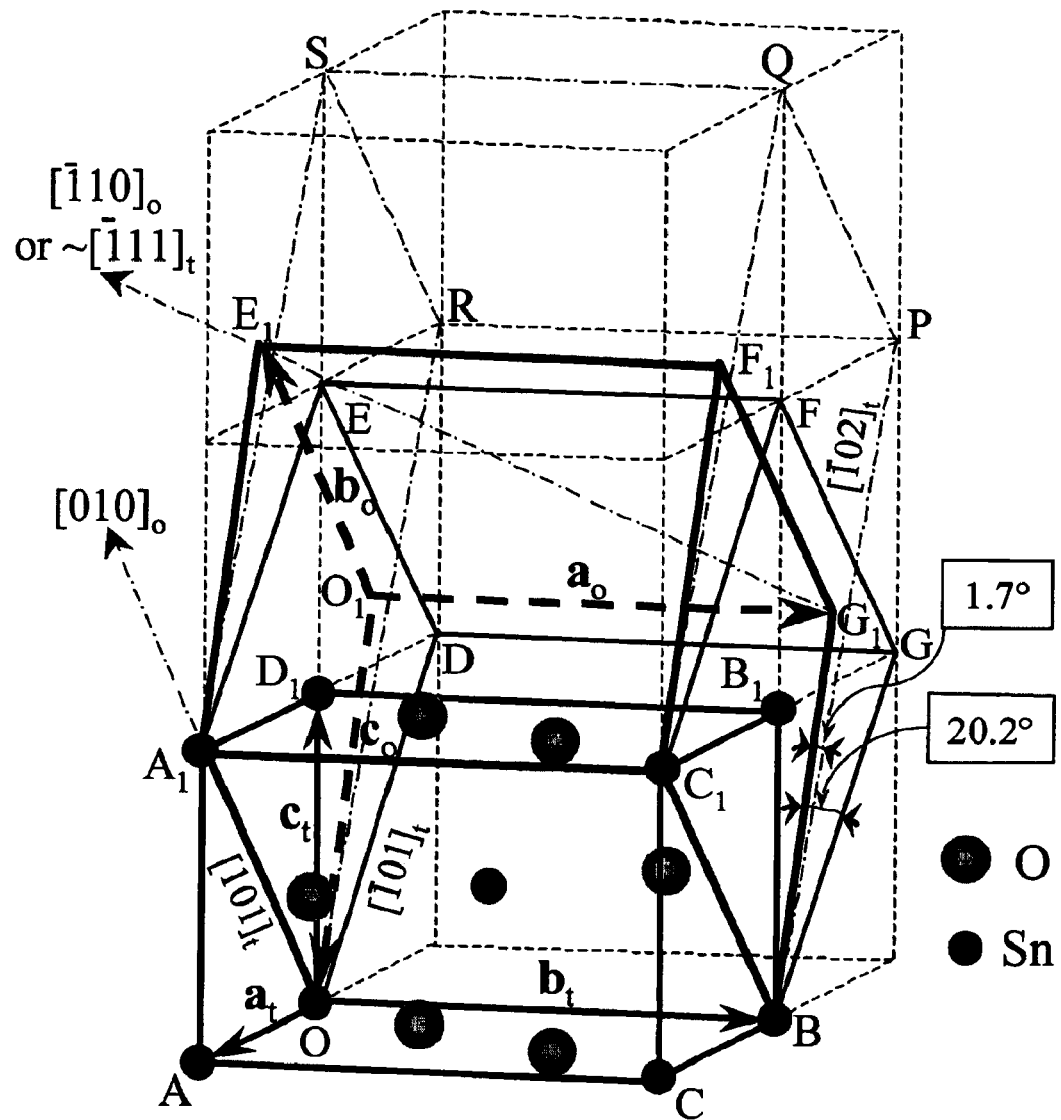
FIG. 9 is a schematic diagram of the crystal structure associated with the $SnO_2$ nanoribbon having a rutile lattice and orthorhombic superlattice. The base vectors of the rutile lattice are represented by $a_r$, $b_r$, and $c_r$, while the base vectors of the orthorhombic superlattice are represented by $a_o$, $b_o$, and $c_o$.

Bulk orthorhombic $SnO_2$ has been synthesized at a high pressure of 158 kbar (Suito, et al., *Mater. Res. Bull.*, 10, 677, (1975)). Although its crystal lattice parameters have been determined, the atomic positions in the crystal have not been reported. In order to understand the structural relationship between the orthorhombic and normal rutile $SnO_2$ regions of the of sandwiched $SnO_2$ nanoribbon, a schematic diagram of the crystal structures is illustrated in FIG. 9. The diagram shown in FIG. 9 is constructed on the basis of the orientation relationships between the orthorhombic and rutile $SnO_2$ crystal lattices of the sandwiched $SnO_2$ nanoribbon. The rectangular parallelepiped $BOAC$-$B_1D_1A_1C_1$ represents a unit cell for the rutile $SnO_2$ crystal lattice. Here, the large spheres denote oxygen atoms and small spheres tin atoms. Six unit cells of the rutile $SnO_2$ crystal lattice are drawn in the diagram, as indicated by the dotted lines. The rectangular parallelepiped $A_1OBC_1$-$E_1O_1G_1F_1$ is a unit cell for the orthorhombic $SnO_2$ crystal lattice. This unit cell of the orthorhombic $SnO_2$ crystal superlattice can be regarded as forming from the parallelepiped $A_1OBC_1$-EDGF in the rutile $SnO_2$ crystal lattice by shearing along the $[101]_r$ crystal direction, followed by a slight compression along the c-axis of the orthorhombic $SnO_2$ crystal lattice. The shearing angle is 20.2° and the compression in length is 1.6%. The dimensions of the a-axis and b-axis of the orthorhombic $SnO_2$ crystal superlattice are also adjusted very slightly (0.5% compression in the a-axis and 0.3% expansion in the b-axis) relative to the corresponding spacing distances in the rutile $SnO_2$ crystal lattice. The volume decrease is 1.8%. The volume change results in the semi-coherent boundary between the orthorhombic and rutile $SnO_2$ crystal lattice (FIG. 8) and might be responsible for the missing parts of the side layers in the sandwiched $SnO_2$ nanoribbon shown in FIG. 5. The $[001]_o$ (c-axis) crystal direction is not exactly parallel to $[10\bar{2}]_r$. Instead, there is an included angle of 1.7° between $[001]_o$ and $[10\bar{2}]_r$, which can be barely detected from the select area electron diffraction patterns shown in FIG. 4 and FIG. 5B. The growth directions of the sandwiched $SnO_2$ nanoribbons are also indicated as $[010]_o/[101]_r$ and $[\bar{1}10]_o/[\bar{1}11]_r$.

EXAMPLE 4

Figures 10A, 10B, 10C, 10D, 10E:
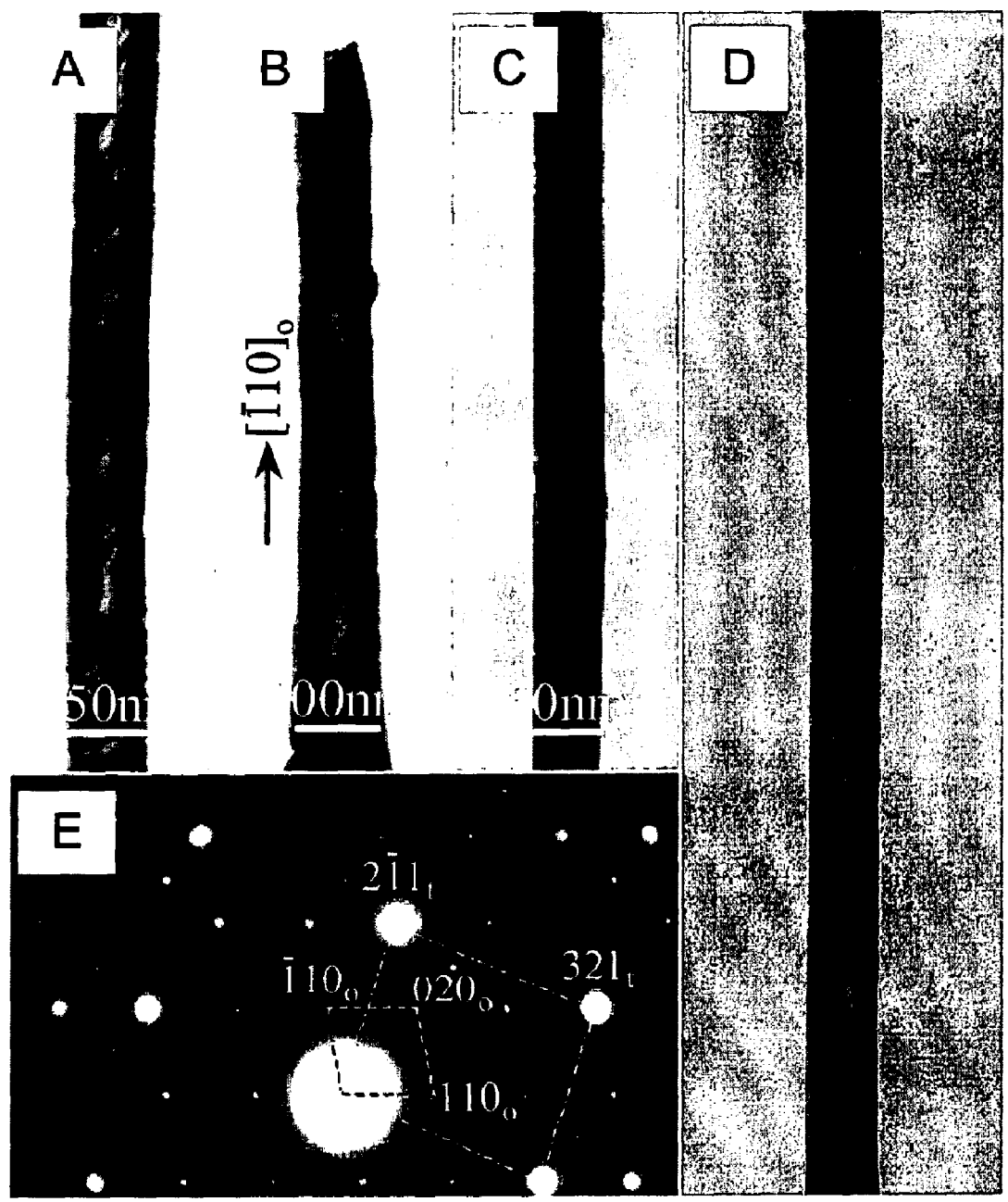

$SnO_2$ Nanotubes $SnO_2$ nanotubes having a rutile crystal lattice and an orthorhombic crystal superlattice structure have been formed using the apparatus discussed above by heating SnO powder to a furnace temperature of about 1100 C. and at a pressure of about 250 Torr, as shown in FIGS. 10A through 10D. FIGS. 10A through 10D correspond to TEM images of $SnO_2$ nanotubes having a rutile crystal lattice and an orthorhombic crystal superlattice structure. The chemical composition of the $SnO_2$ nanotubes corresponds to $SnO_2$. The bright contrast for the center part of the $SnO_2$ nanotubes is accompanied by the dark sides even with tilting of the sample under TEM observation. This indicates that the $SnO_2$ nanotubes have hollow cores. The diameter size of the $SnO_2$ nanotubes varies from about 35 nm (FIGS. 10C–D) to 100 nm (FIG. 10A) and their typical length is between about 3 micrometers and 5 micrometers. The hollow core is not always continuous through the entire length of the sample, especially for those nanotubes of smaller (diameter) size (FIGS. 10C–D). For the $SnO_2$ nanotubes with large diameters, the hollow core displays a zig-zag shape (FIG. 10A).

Electron diffraction analyses indicate that the $SnO_2$ nanotubes correspond to a single crystal. FIG. 10E illustrates a SAD pattern taken for the $SnO_2$ nanotube depicted in FIG. 10B. Here, the reflections with strong intensities are indexed to belong to the $[3\bar{1}\bar{7}]_t$ zone axis of the rutile $SnO_2$ crystal lattice and the weak reflections correspond to an orthorhombic $SnO_2$ crystal superlattice along the $[001]_o$ zone axis. The orientation relationship between the orthorhombic $SnO_2$ and the rutile $SnO_2$ crystal lattice is determined to be $[001]_o\|[3\bar{1}\bar{7}]_t$ and $\pm(110)_o\|(451)_t$. The growth direction of the $SnO_2$ nanotubes is parallel to $[\bar{1}10]_o$ in relation to the orthorhombic $SnO_2$ position, which is the same as that for the $SnO_2$ sandwiched nanoribbons.

It should be emphasized that the above-described embodiments of the present invention, particularly, any embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A nanostructure, comprising a tin oxide ($SnO_2$) nanowire.

2. The nanostructure of claim 1, wherein the $SnO_2$ nanowire is substantially rectangular.

3. The nanostructure of claim 1, wherein the $SnO_2$ nanowire has a thickness-to-width aspect ratio ranging from about 1:2 to about 1:5.

4. The nanostructure of claim 1, wherein the $SnO_2$ nanowire has a length between about 10 micrometers to 300 micrometers.

5. A nanostructure, comprising a tin oxide ($SnO_2$) nanowire having a rutile crystal lattice and an orthorhombic crystal superlattice.

6. The nanostructure of claim 5, wherein the $SnO_2$ nanowire has a rectangular cross-section and is enclosed by $\pm(100)_o/\pm(010)_t$ and $\pm(001)_o/\pm(10\bar{1})_t$ facet planes and a growth direction along the $[010]_o$ crystal direction that is parallel to $[101]_t$ of the $SnO_2$ rutile crystal lattice.

7. The nanostructure of claim 5, wherein the orientation relationship between the orthorhombic $SnO_2$ supperlattice and the rutile $SnO_2$ crystal lattice of the $SnO_2$ nanowire corresponds to $[001]_o\|[10\bar{2}]_t$ and $(100)_o\|(010)_t$.

8. The nanostructure of claim 5, wherein the $SnO_2$ nanowire is substantially circular.

9. The nanostructure of claim 5, wherein the $SnO_2$ nanowire is substantially rectangular.

10. The nanostructure of claim 5, wherein the $SnO_2$ nanowire has a diameter between about 10 nanometers to 100 nanometers.

11. The nanostructure of claim 5, wherein the $SnO_2$ nanowire has a length between about 10 micrometers to 300 micrometers.

12. A nanostructure, comprising a tin oxide ($SnO_2$) sandwiched nanoribbon.

13. The nanostructure of claim 12, wherein the $SnO_2$ sandwiched nanoribbon has a rutile crystal lattice and an orthorhombic crystal superlattice.

14. The nanostructure of claim 12, wherein the orientation relationship between the orthorhombic $SnO_2$supperlattice and the rutile $SnO_2$ crystal lattice of the $SnO_2$ sandwiched nanoribbon corresponds to $[001]_o\|[10\bar{2}]_t$ and $(100)_o\|(010)_t$.

15. The nanostructure of claim 12, wherein the $SnO_2$ sandwiched nanoribbon is enclosed by $\pm(110)_o/\pm(231)_t$ and $(001)_o/\pm(10\bar{1})_t$ facet planes, and wherein the growth directions are parallel to $[110]_o/[111]_t$.

16. The nanostructure of claim 12, wherein the $SnO_2$ sandwiched nanoribbon has a first side thickness of about 20 nanometers, a second side thickness of about 20 nanometers, and a core layer width of about 120 nanometers.

17. The nanostructure of claim 12, wherein the $SnO_2$ sandwiched nanoribbon has a length between about 10 micrometers to 300 micrometers.

18. A nanostructure, comprising a tin oxide ($SnO_2$) nanotube.

19. The nanostructure of claim 18, wherein the $SnO_2$ nanotube has a rutile crystal lattice and an orthorhombic crystal superlattice.

20. The nanostructure of claim 18, wherein the $SnO_2$ nanotube is substantially hollow.

21. The nanostructure of claim 18, wherein the $SnO_2$ nanotube has a growth direction parallel to $[\bar{1}10]_o$ with respect to the orthorhombic $SnO_2$ superlattice.

22. The nanostructure of claim 18, wherein the $SnO_2$ nanotube has a diameter of between about 50 nanometers and 350 nanometers and a length of about 3 to about 5 micrometers.

23. The nanostructure of claim 18, wherein the orientation relationship between the orthorhombic $SnO_2$ supperlattice and the rutile $SnO_2$ crystal lattice of the $SnO_2$ nanotube corresponds to $[001]_o\|[3\bar{1}\bar{7}]_t$ and $\pm(110)_0\|(451)_t$.

24. A structure, comprising a nanostructure having a rutile crystal lattice and an orthorhombic crystal superlattice 29.

25. The structure of claim 24, wherein the nanostructure is selected from a $SnO_2$ nanowire, a $SnO_2$ nanoribbon, a $SnO_2$ nanotube.

26. The structure of claim 24, wherein the nanostructure has a thickness-to-width aspect ratio ranging from about 1:2 to about 1:5.

27. The structure of claim 24, wherein the nanostructure is substantially circular.

28. The structure of claim 24, wherein the nanostructure is substantially rectangular.

29. The structure of claim 24, wherein the nanostructure has a diameter between about 10 nanometers to 100 nanometers.

30. The structure of claim 24, wherein the nanostructure is selected from a $SnO_2$ nanowire.

31. The structure of claim 24, wherein the nanostructure is selected from a $SnO_2$ nanoribbon.

32. The structure of claim 24, wherein the nanostructure is selected from a $SnO_2$ nanotube.

33. A nanostructure, comprising a tan oxide ($SnO_2$) nanowire, wherein the $SnO_2$ nanowire has a rutile crystal structure.

34. The nanostructure of claim 33, wherein the $SnO_2$ nanowire is substantially rectangular.

35. The nanostructure of claim 33, wherein the $SnO_2$ nanowire has a thickness-to-width aspect ratio ranging from about 1:2 to about 1:5.

36. The nanostructure of claim 33, wherein the $SnO_2$ nanowire has a length between about 10 micrometers to 300 micrometers.

37. A nanostructure, comprising a tin oxide ($SnO_2$) nanowire, wherein the $SnO_2$ nanowire is substantially circular.

38. The nanostructure of claim 37, wherein the $SnO_2$ nanowire has a thickness-to-width aspect ratio ranging from about 1:2 to about 1:5.

39. The nanostructure of claim 37, wherein the $SnO_2$ nanowire has a length between about 10 micrometers to 300 micrometers.

40. A nanostructure, comprising a tin oxide ($SnO_2$) nanowire, wherein the $SnO_2$ nanowire has a rectangular cross section enclosed by $\pm(010)$ and $\pm(10\bar{1})$ facet planes, and wherein the growth direction is parallel the [101] crystal direction.

41. The nanostructure of claim 40, wherein the $SnO_2$ nanowire is substantially rectangular.

42. The nanostructure of claim 40, wherein the $SnO_2$ nanowire has a thickness-to-width aspect ratio ranging from about 1:2 to about 1:5.

43. The nanostructure of claim 40, wherein the $SnO_2$ nanowire has a length between about 10 micrometers to 300 micrometers.

44. A nanostructure, comprising a tin oxide ($SnO_2$) nanowire, wherein the $SnO_2$ nanowire has a diameter between about 10 nanometers to 100 nanometers.

* * * * *

UNITED STATES PATENT AND TRADEMARK OFFICE
CERTIFICATE OF CORRECTION

PATENT NO. : 6,940,086 B2 Page 1 of 1
APPLICATION NO. : 10/261149
DATED : September 6, 2005
INVENTOR(S) : Gole et al.

It is certified that error appears in the above-identified patent and that said Letters Patent is hereby corrected as shown below:

Column 10, line 29, delete "29".

Column 10, line 49, delete "tan" and replace with --tin--.

Signed and Sealed this

Twenty-ninth Day of May, 2007

JON W. DUDAS
*Director of the United States Patent and Trademark Office*